(12) United States Patent
Chung et al.

(10) Patent No.: US 12,525,459 B2
(45) Date of Patent: Jan. 13, 2026

(54) ETCHING APPARATUS AND ETCHING METHOD USING THE SAME

(71) Applicant: IUCF-HYU (Industry-University Cooperation Foundation Hanyang University), Seoul (KR)

(72) Inventors: Chin-Wook Chung, Seoul (KR); Jiwon Jung, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 315 days.

(21) Appl. No.: 18/058,931

(22) Filed: Nov. 28, 2022

(65) Prior Publication Data

US 2023/0386788 A1    Nov. 30, 2023

(30) Foreign Application Priority Data

May 30, 2022   (KR) .................... 10-2022-0065827
Oct. 5, 2022   (KR) .................... 10-2022-0127017

(51) Int. Cl.
*H01L 21/3065*  (2006.01)
*H01L 21/311*   (2006.01)
(Continued)

(52) U.S. Cl.
CPC .... *H01L 21/3065* (2013.01); *H01L 21/31116* (2013.01); *H01L 21/32136* (2013.01);
(Continued)

(58) Field of Classification Search
CPC .......... H01L 21/3065; H01L 21/34446; H01L 21/32136; H01J 2237/3341;
(Continued)

(56) References Cited

U.S. PATENT DOCUMENTS 6,909,086 B2   6/2005   Samukawa et al.
9,147,581 B2   9/2015   Guha
(Continued)

FOREIGN PATENT DOCUMENTS

JP    2002-289581 A    10/2002
JP    2019-050413 A     3/2019
(Continued)

*Primary Examiner* — Anita K Alanko
(74) *Attorney, Agent, or Firm* — Harness, Dickey & Pierce, P.L.C.

(57) ABSTRACT

Provided is an etching method. The etching method includes loading a substrate into a process chamber, wherein the process chamber includes a first chamber part and a second chamber part, and the substrate is loaded into the second chamber part, supplying high-density gas plasma to the first chamber part, supplying ultra-low electron temperature plasma to the second chamber part using at least a portion of the high-density gas plasma, adsorbing radicals of the ultra-low electron temperature plasma to a surface of the substrate, and applying a bias to the substrate to accelerate at least one of ions or electrons of the ultra-low electron temperature plasma so as to collide with the substrate.

9 Claims, 11 Drawing Sheets

(51) Int. Cl.
*H01L 21/3213* (2006.01)
*H01J 37/32* (2006.01)

(52) U.S. Cl.
CPC ... *H01J 37/32146* (2013.01); *H01J 37/32357* (2013.01); *H01J 37/32422* (2013.01); *H01J 37/32449* (2013.01); *H01J 2237/3341* (2013.01)

(58) Field of Classification Search
CPC ........... H01J 37/32146; H01J 37/32357; H01J 37/32422; H01J 37/32449
See application file for complete search history.

(56) References Cited

U.S. PATENT DOCUMENTS

| | | |
|---|---|---|
| 10,553,399 B2 | 2/2020 | Marakhtanov et al. |
| 2005/0211171 A1 | 9/2005 | Hanawa et al. |
| 2011/0008025 A1 | 1/2011 | Lee |
| 2011/0192820 A1 | 8/2011 | Yeom et al. |
| 2016/0141188 A1 | 5/2016 | Singh et al. |
| 2016/0276134 A1 | 9/2016 | Collins et al. |
| 2022/0068607 A1* | 3/2022 | Ventzek ............ H01J 37/32449 |
| 2022/0165546 A1* | 5/2022 | Lill ................... H01J 37/32082 |

FOREIGN PATENT DOCUMENTS

| | | |
|---|---|---|
| KR | 1020090094627 A | 9/2009 |
| KR | 101080604 B1 | 11/2011 |
| KR | 1020150007993 A | 1/2015 |
| KR | 101529821 B1 | 6/2015 |
| KR | 1020140121367 A | 10/2015 |
| KR | 101652845 B1 | 9/2016 |
| KR | 1020170130467 A | 11/2017 |
| KR | 1020200004139 A | 1/2020 |
| WO | 2011/005582 A1 | 1/2011 |

* cited by examiner

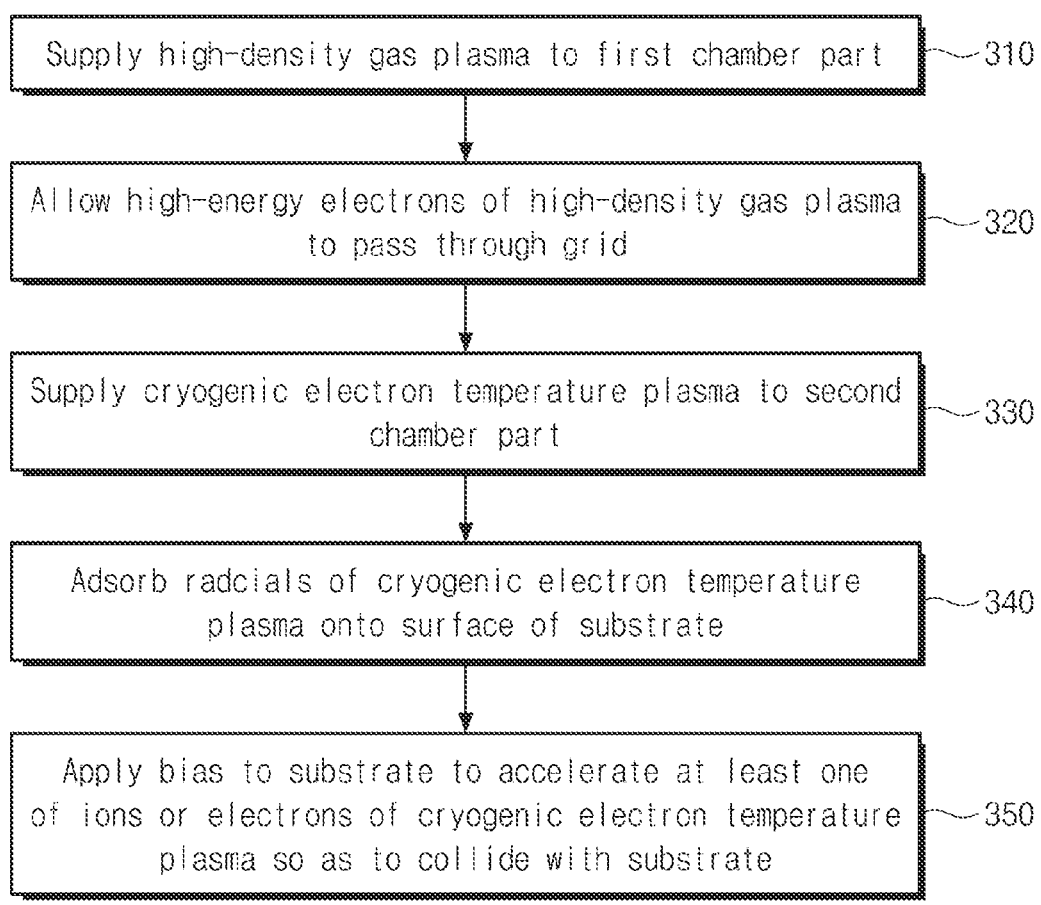

ETCHING APPARATUS AND ETCHING METHOD USING THE SAME

CROSS-REFERENCE TO RELATED APPLICATIONS

This U.S. non-provisional patent application claims priority under 35 U.S.C. § 119 of Korean Patent Application Nos. 10-2022-0065827, filed on May 30, 2022, and 10-2022-0127017, filed on Oct. 5, 2022, the entire contents of which are hereby incorporated by reference.

BACKGROUND

The present disclosure herein relates to an etching apparatus and an etching method, and more particularly, to an etching apparatus and method using ultra-low electron temperature plasma.

Plasma is an ionized gas composed of positive ions, negative ions, electrons, excited atoms, molecules, and highly chemically active radicals and is also called a fourth state of a material because of having properties that are very different electrically and thermally from those of an ordinary gas. Since such plasma contains an ionized gas, the plasma is accelerated using electric or magnetic fields or chemically reacts to perform cleaning, etching, or deposition on a wafer or a substrate, and thus, is very usefully used in a semiconductor manufacturing process.

Recently, in the semiconductor manufacturing process, a plasma generating device that generates high-density gas plasma is being used. Representative examples of a plasma module that generates plasma include various plasma modules such as a capacitively coupled plasma (CCP) module using a radio frequency, an inductively coupled plasma (ICP) module, and the like.

In an etching process using plasma, since an adsorption process of adsorbing radicals and a desorption process of desorbing an etch target are sequentially performed, and types of gases used in the adsorption process and the desorption process are different from each other, a 'purge process' may also be performed between the two processes.

SUMMARY

The present disclosure provides an etching method and apparatus, in which a purge process is omitted in an etching process while solving a limitation of causing physical and electrical damages to a specific material layer of a substrate to reduce a process time.

The present disclosure also provide an etching method and apparatus, in which ultra-low electron temperature plasma is generated in a plasma chamber, in which an etching process is performed, to more quickly perform an adsorption process, thereby reducing a process time.

The object of the present invention is not limited to the aforesaid, but other objects not described herein will be clearly understood by those skilled in the art from descriptions below.

An embodiment of the inventive concept provides an etching apparatus including: a first chamber part in which high-density gas plasma is generated; a second chamber part in which ultra-low electron temperature plasma is generated; a substrate which is disposed in the second chamber part and of which a voltage applied thereto is adjustable; and a plurality of grids between the first chamber part and the second chamber part, wherein the plurality of grids are configured to allow a potential difference between the plurality of grids to be lower than a potential of the ultra-low electron temperature plasma so that high-energy electrons pass through the grids, and low-energy electrons are blocked by the grids, a plasma potential on the substrate is less than that of the first chamber part, and a voltage applied to the plurality of grids is adjusted to accelerate or block electrons or ions.

In an embodiment of the inventive concept, an etching method includes: loading a substrate into a process chamber, wherein the process chamber includes a first chamber part and a second chamber part, and the substrate is loaded into the second chamber part; supplying high-density gas plasma to the first chamber part; supplying ultra-low electron temperature plasma to the second chamber part using at least a portion of the high-density gas plasma; adsorbing radicals of the ultra-low electron temperature plasma to a surface of the substrate; and applying a bias to the substrate to accelerate at least one of ions or electrons of the ultra-low electron temperature plasma so as to collide with the substrate.

In an embodiment of the inventive concept, an etching method includes: loading a substrate into a process chamber, wherein the process chamber includes a first chamber part and a second chamber part, and a first grid, a second grid, and a third grid are disposed between the first chamber part and the second chamber part; supplying high-density gas plasma to the first chamber part; blocking low-energy electrons and negative ions of the high-density gas plasma by the first grid; blocking positive ions of the high-density gas plasma by the second grid; accelerating the electrons through a potential difference between the first grid and the second grid; blocking plasma of the second chamber part from moving to the first chamber part by the third grid; allowing high-energy electrons of the high-density gas plasma passing through the first grid, the second grid, and the third grid to collide with the ions of the second chamber part so as to generate ultra-low electron temperature plasma; adsorbing radicals of the ultra-low electron temperature plasma onto a surface of the substrate; and applying a bias to the substrate to accelerate at least one of ions or electrons of the ultra-low electron temperature plasma so as to collide with the substrate.

Particularities of other embodiments are included in the detailed description and drawings.

BRIEF DESCRIPTION OF THE FIGURES

The accompanying drawings are included to provide a further understanding of the inventive concept, and are incorporated in and constitute a part of this specification. The drawings illustrate embodiments of the inventive concept and, together with the description, serve to explain principles of the inventive concept. In the drawings:

FIG. 5B is a flowchart illustrating an etching method according to an embodiment;

DETAILED DESCRIPTION

Hereinafter, embodiments of the inventive concept will be described in detail with reference to the accompanying drawings.

A method and apparatus for etching a semiconductor substrate and layers formed on the semiconductor substrate during manufacture of semiconductor elements are proposed in embodiments of the inventive concept.

For example, in the etching, after radicals are adsorbed (adsorption process) onto a surface of an etch target material, ions or electrons may collide with the etch target material to which the radicals are adsorbed to remove (desorption process). Then, the above-described process may be repeatedly performed to etch a layer to be treated (hereinafter, referred to as a treated layer) one by one in an atomic unit.

In the etching, ion bombardment may be used to give a physical impact to the etch target. In this case, plasma (ultra-low electron temperature plasma) having a very low electron temperature of about 1.0 eV or less may be used. In the etching using ions, when the ultra-low electron temperature plasma is generated on the substrate, a very low sheath potential may be generated on the substrate. In this case, energy for bombarding the ion substrate may be lowered, and thus, the ion bombardment may not have an unnecessary effect on the surface. In the ultra-low electron temperature plasma, an electron temperature may be low, and thus, several unnecessary chemical reactions may not occur. When a pulse voltage is applied to the substrate in the ultra-low electron temperature plasma, the etching process may be performed quickly without damaging the substrate due to the ion bombardment.

Hereinafter, in embodiments of the inventive concept, when the treated layer is desorbed, since the ultra-low electron temperature plasma is used, a structural deformation of the etch target material may be minimized, and also, since the desorption is quickly performed within the plasma, an adsorption time may be reduced to reduce a process time and minimize a change in electrical characteristics.

Figure 1:
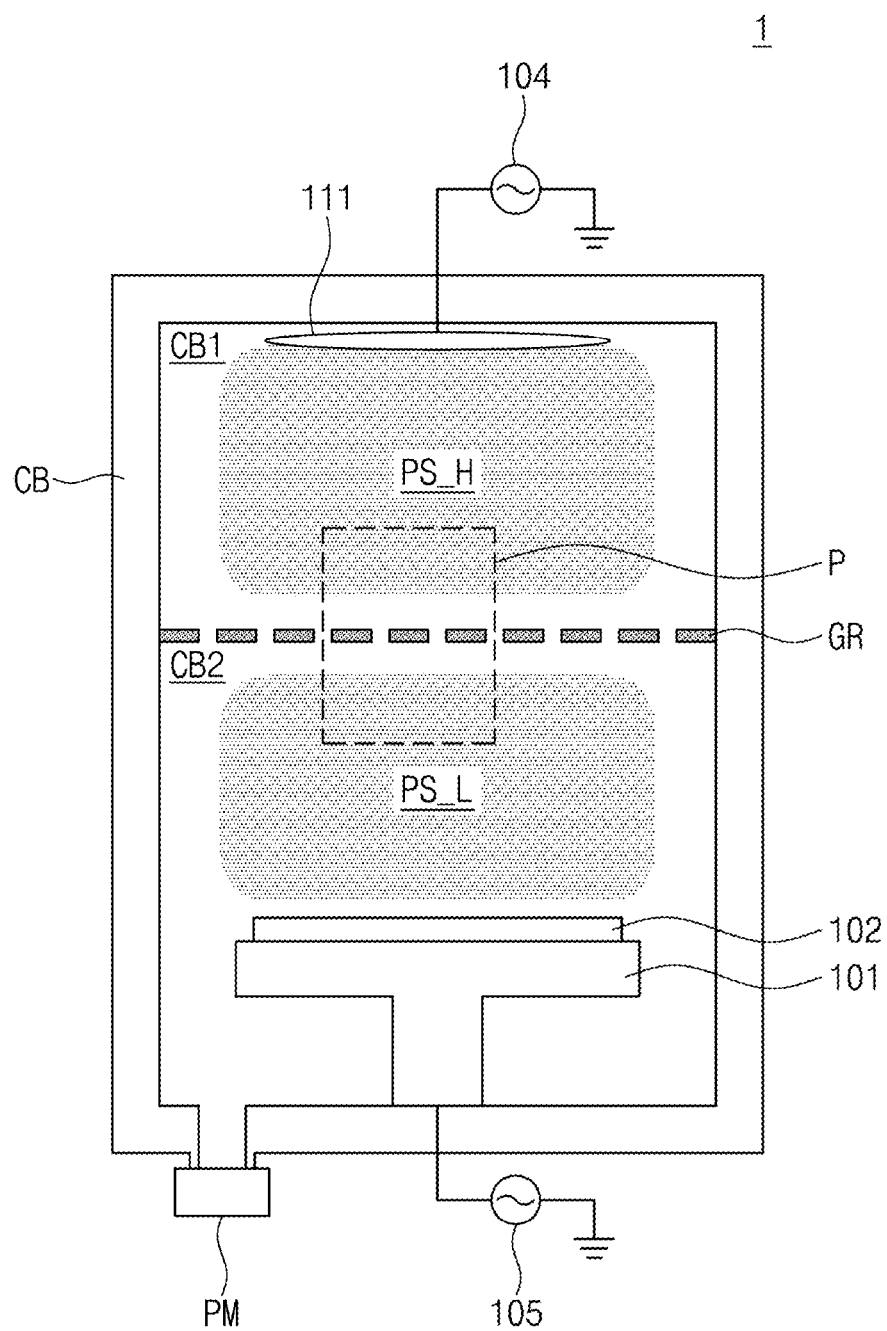
FIG. 1 is a cross-sectional view of an etching apparatus according to an embodiment.

FIG. 1 is a cross-sectional view of an etching apparatus according to an embodiment.

Referring to FIG. 1, an etching apparatus 1 is provided. The etching apparatus 1 may etch various targets. For example, the etching apparatus 1 may etch a substrate or a mask. That is, the etching apparatus 1 may be an apparatus for etching one surface of the substrate or the mask to form a pattern on the one surface.

The etching apparatus 1 may include a process chamber CB, a grid GR, a first power supply 104, a second power supply 105, an RF coil 111, a support 101, and a pump PM.

The process chamber CB may include a first chamber part CB1 and a second chamber part CB2. The first chamber part CB1 may be disposed on the second chamber part CB2. The grid GR may be disposed between the first chamber part CB1 and the second chamber part CB2.

A gas may be injected into the process chamber CB. The gas may be supplied into the first chamber part CB1.

High-density gas plasma PS_H may be generated in the first chamber part CB1 of the process chamber CB. The first chamber part CB1 may be a high-density gas plasma region. The high-density gas plasma PS_H may include radicals, electrons, and ions of the gas. The high-density gas plasma PS_H may be generated by injecting a gas into the first chamber part CB1 and applies power to the RF coil 111 through the first power supply part 104 to induce an electric field in the first chamber part CB1.

The method for generating the high-density gas plasma PS_H in the first chamber part CB1 is not limited to the above-described embodiment, and the first chamber part CB1 may have various configurations to generate the high-density gas plasma PS_H. For example, the first chamber part CB1 may have various sources such as capacitively coupled plasma (CCP), inductively coupled plasma (ICP), electron beam source, microwave plasma, and the like and may induce the high-density gas plasma PS_H. The high-density gas plasma PS_H may include adsorption gas plasma and etching gas plasma.

The first chamber part CB1 and the second chamber part CB2 may be defined based on the grid GR. The grid GR may be disposed between the first chamber part CB1 and the second chamber part CB2. The second chamber part CB2 may be a ultra-low electron temperature plasma region.

In an embodiment, the grid GR may include a metal. The grid GR may include, for example, graphite or molybdenum. A voltage may be applied or may not be applied to the grid GR. A voltage may be applied to the grid GR to accelerate high-energy electrons in the high-density gas plasma PS_H.

In an embodiment, one grid GR may include a plurality of through-holes.

The support 101 may be disposed in the second chamber part CB2. The support 101 may support the substrate 102. The support 101 may include a metal. Any voltage may be applied to the support 101. A voltage may be applied or may not be applied to the support 101.

The substrate 102 may be disposed in the second chamber part CB2. Here, the voltage may be adjustable. The substrate 102 may be disposed on the support 101. The substrate 102 may include a metal or a metal compound. The substrate 102 may include at least one of copper (Cu), chromium (Cr), nickel (Ni), aluminum (Al), other metals, or alloys thereof. In an embodiment, the substrate 102 may include silicon (Si). For example, the substrate 102 may include a silicon wafer.

The second chamber part CB2 may receive the ultra-low electron temperature plasma using at least a portion of the high-density gas plasma. The ultra-low electron temperature plasma described in the present disclosure refers to plasma having a low electron temperature. Hereinafter, the ultra-low electron temperature plasma is defined as plasma having an electron temperature of about 1.0 eV or less.

The second power supply 105 may apply a voltage to the support 101. The power from the second power supply 105 may be applied to the substrate 102 through the support 101.

A bias applied to the substrate 102 may be adjusted, and thus, radicals contained in the ultra-low electron temperature plasma PS_L may be adsorbed to the surface of the substrate 102, and the bias may be applied through at least a portion of the substrate 102 to accelerate at least one of electrons or ions contained in the ultra-low electron temperature plasma so as to collide with the substrate 102, thereby etching the etch target.

For example, when a bias of 0 V is applied to the substrate 102, and when a potential of the substrate 102 is 0 V, a sheath potential may not be generated on the substrate 102 due to a very low electron temperature, and even if the sheath potential is generated, a very low sheath potential may be generated. Thus, an electric field by which charged particles such as ions or electrons contained in the ultra-low electron temperature plasma PS_L are accelerated to the substrate 102 may not be generated. Thus, only electrically neutral radicals may adhere to the substrate 102 by diffusion, and thus, an adsorption reaction may occur.

In addition, when a bias such as an RF or DC voltage is applied through at least a portion of the substrate 102, according to polarities of the voltage, electrons may be directed to the substrate 102 in case of a positive (+) voltage, and (positive) ions may be directed to the substrate 102 in case of a negative (−) voltage. As a result, a portion of the surface of the substrate 102 coupled to the radicals adsorbed with their energy may be desorbed.

In the ultra-low electron temperature plasma PS_L, since the electron temperature is very low, the sheath potential may also be very low, and thus, the energy of the ions accelerated through the sheath may be very small. When the etching is performed using this process, there is an advantage that the electrons or ions do not etch the surface of the substrate 102 in the adsorption process. Thus, when a pulse voltage is applied to the substrate 102, a purge process required in the typical etching process may be omitted.

The pump PM may be connected to the process chamber CB to enable a vacuum control during the etching process and remove gaseous byproducts from the process chamber CB. In an embodiment, in the purge process, the gaseous by-products of the process chamber CB may be discharged through the pump.

Figure 2:
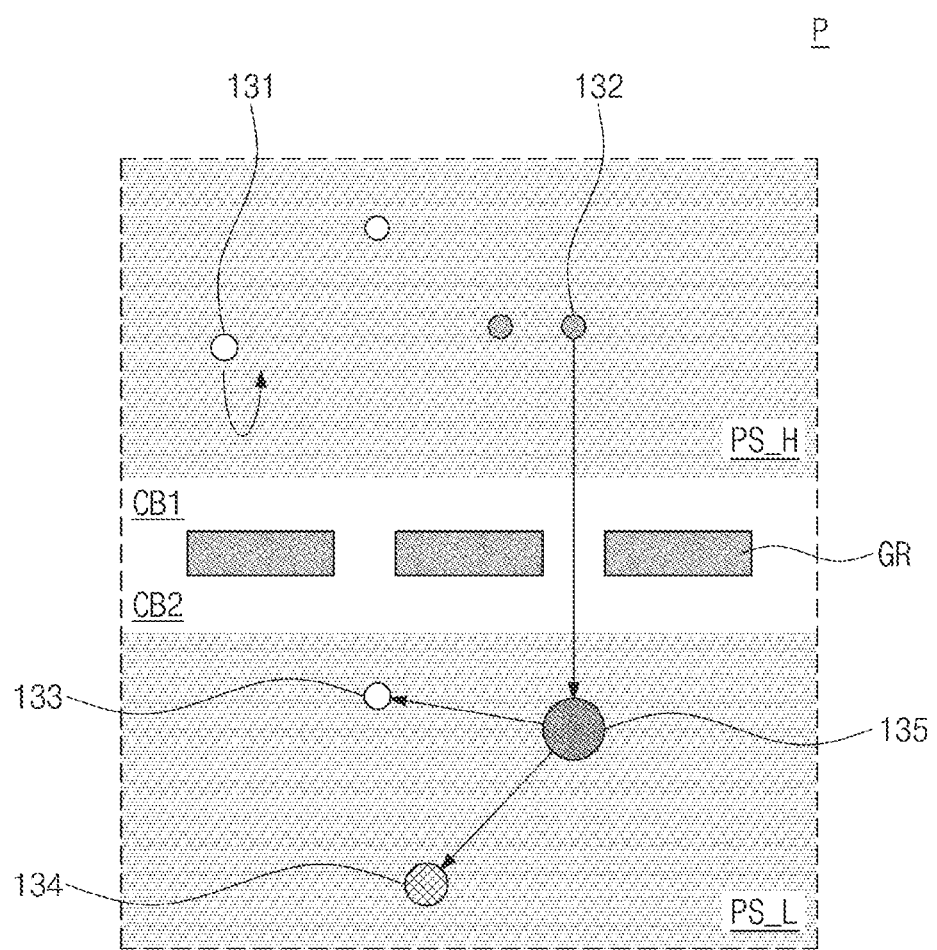
FIG. 2 is an enlarged view illustrating a portion P of FIG. 1 according to an embodiment.

FIG. 2 is an enlarged view illustrating a portion P of FIG. 1 according to an embodiment.

Referring to FIG. 2, the ultra-low electron temperature plasma PS_L may be supplied to the second chamber part CB2 through the grid GR.

The high-density gas plasma PS_H of the first chamber part CB1 may include low-energy electrons 131 and high-energy electrons 132. A voltage may be applied to the grid GR.

The grid GR may be configured to allow the potential of the grid GR to be lower than the potential of the ultra-low electron temperature plasma below the grid GR so that the high-energy electrons 132 pass through the grid GR, and the low-energy electrons 131 are blocked by the grid GR. This may also be the case when the grid GR includes a plurality of grids GR.

According to an embodiment, a voltage power supply capable that applies a high voltage of several tens to several hundreds of V may be connected to the grid GR. A potential difference may be generated between the plasma and an electrode or an insulator. Here, a region in which the potential difference occurs may be defined as a sheath, and the potential difference appearing in the sheath may be defined as a sheath potential. As a result, the sheath potential of the first chamber part CB1 may be generated on the grid GR that is in contact with the high-density gas plasma of the first chamber part CB1. Only the high-energy electrons 132 exceeding the sheath potential energy of the first chamber part CB1 may move to the second chamber part CB2.

The high-energy electrons 132 of the high-density gas plasma PS_H may exceed the sheath potential energy of the first chamber part CB1 generated on the grid GR to move to the second chamber part CB2. The low-energy electrons 131 of the high-density gas plasma PS_H may not exceed the sheath potential energy of the first chamber part CB1 generated on the grid GR and thus may not move to the second chamber part CB2. The sheath potential of the second chamber part CB2 may be generated under the grid GR. The sheath potential of the second chamber part CB2 may accelerate the electrons, unlike the sheath potential of the first chamber part CB1. Thus, when the electron energy of the high-energy electrons 132 passing through the grid GR is amplified by allowing the plasma potential of the second chamber part CB2 to be larger than the plasma potential of the first chamber part CB1, neutral gases 135 existing in the second chamber part CB2 colliding with the high-energy electrons 132 may be ionized to generate cryogenic electrons 133 and ions 134 having a very low electron temperature. Thus, the sheath potential may be generated on the substrate 102 through a potential difference between the ultra-low electron temperature plasma PS_L of the second chamber unit CB2 and the substrate 102. In this case, the sheath potential on the substrate 102 may be less than the sheath potential of the first chamber part CB1.

Although the sheath potential obtains the cryogenic electrons 133 generated through the ionization in the second chamber part CB2 and the energy in the first chamber part CB1 and thus is lowered below the grid, electrons that have lost energy by participating in the ionization reaction may generate a very low electron temperature. In this case, the ultra-low electron temperature plasma PS_L may be generated in the second chamber part CB2.

For the etching apparatus and method according to an embodiment, the electrons may have a very low electron temperature of about 1.0 eV or less. In the ultra-low electron temperature plasma PS_L, the sheath potential on the substrate 102 may be low, and the energy of the ions 134 accelerated due to the low sheath potential may be low to reduce the damage to the substrate 102 by the ion energy.

According to an embodiment, the second chamber part CB2 may have a structure in which an external electric field does not exist or is very small so that the electrons do not acquire energy by the electric field and maintain a very low electron temperature.

Figure 3:
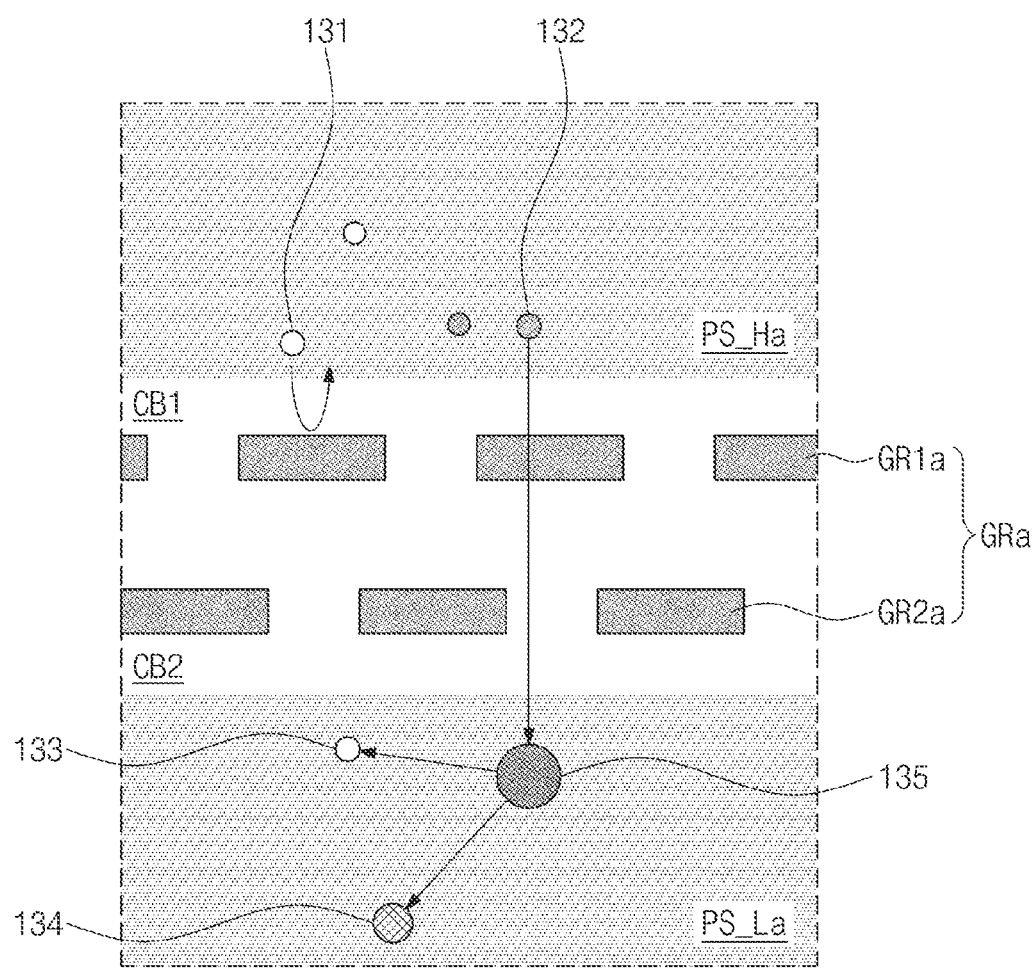
FIG. 3 is an enlarged view of an etching apparatus according to an embodiment.

FIG. 3 is an enlarged view of an etching apparatus according to an embodiment. FIG. 3 may correspond to FIG. 2.

Referring to FIG. 3, a grid GRa may include a plurality of grids GRa. The grid GRa may include a first grid GR1a and a second grid GR2a. The first grid GR1a may be a grid adjacent to a first chamber part CB1. The second grid GR2a may be a grid adjacent to a second chamber part CB2. Ultra-low electron temperature plasma PS_La may be supplied to the second chamber part CB2 through the first grid GR1a and the second grid GR2a.

High-density gas plasma PS_Ha of the first chamber part CB1 may include low-energy electrons 131 and high-energy electrons 132. A voltage may be applied to the first grid GR1a and the second grid GR2a.

According to an embodiment, a voltage power supply capable that applies a high voltage of several tens to several hundreds of V may be connected to the first grid GR1a. A voltage power supply capable of applying a voltage lower than that of the first grid GR1a or a ground may be connected to the second grid GR2a.

Since the high-energy electrons 132 of the high-density gas plasma PS_Ha in the first chamber part CB1 are accelerated by a potential difference between the first grid GR1a and the second grid GR2a, only a desired amount of energy may accelerate the electrons.

The high-energy electrons 132 passing through the grids GR may collide with a neutral gas 135 of the second chamber part CB2, and the neutral gas 135 may be ionized to generate cryogenic electrons 133 having a very low electron temperature and ions 134.

Although the sheath potential obtains the cryogenic electrons 133 generated through the ionization in the second chamber part CB2 and the energy in the first chamber part CB1 and thus is lowered below the grid, electrons that have lost energy by participating in the ionization reaction may generate a very low electron temperature. In this case, the ultra-low electron temperature plasma PS_La may be generated in the second chamber part CB2.

When energy of the accelerated electrons is precisely controlled, radical generation and the like may be selectively controlled in the second chamber part CB2. In addition, a gas used in the process may be injected into different regions according to process positions so as to be utilized for controlling the etching/deposition processes.

Figure 4:
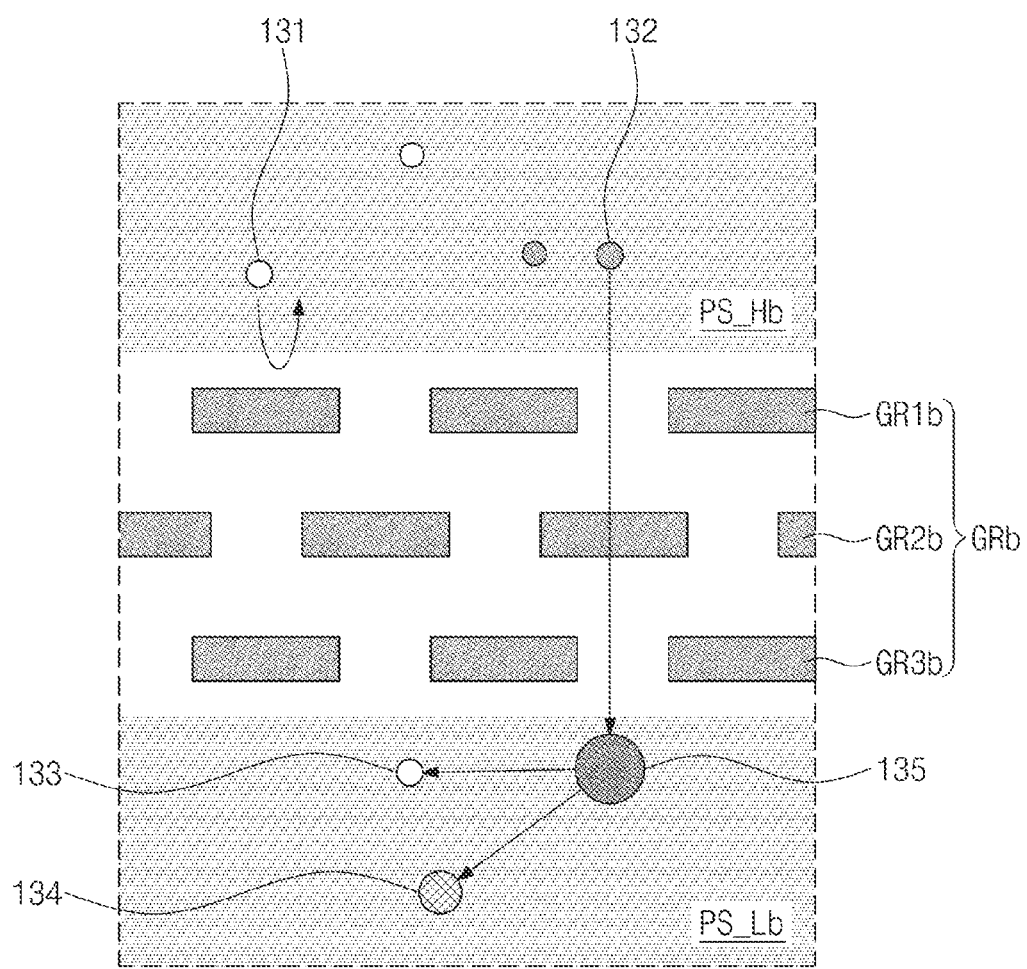
FIG. 4 is an enlarged view of an etching apparatus according to an embodiment.

FIG. 4 is an enlarged view of an etching apparatus according to an embodiment. FIG. 4 may correspond to FIG. 2.

Referring to FIG. 4, a grid GRb may include a plurality of grids GRb. The grid GRb may include a first grid GR1b, a second grid GR2b, and a third grid GR3b. The first grid GR1 may be a grid adjacent to a first chamber part CB1. The third grid GR3 may be a grid adjacent to a second chamber part CB2. The second grid GR2 may be disposed between the first grid GR1 and the third grid GR3. Ultra-low electron temperature plasma PS_Lb may be supplied to the second chamber part CB2 through the first grid GR1b, the second grid GR2b, and the third grid GR3b.

High-density gas plasma PS_Hb of the first chamber part CB1 may include low-energy electrons 131 and high-energy electrons 132. A voltage of several tens to hundreds of V may be applied to the first grid GR1b, the second grid GR2b, and the third grid GR3b.

The voltage applied to the plurality of grids GRb may be adjusted to accelerate or block electrons or ions. The voltages of the first grid GR1b, the second grid GR2b, and the third grid GR3b may be adjusted. For example, a negative voltage may be applied to the first grid GR1b to block the low-energy electrons 131 and negative ions. A positive voltage may be applied to the second grid GR2b to block positive ions and accelerate electrons. The third grid GR3b may block an inflow of the ultra-low electron temperature plasma PS_Lb of the second chamber part CB2 into the first chamber part CB1 to secure a flux of the electrons.

The grid GRb including the first grid GR1b, the second grid GR2b, and the third grid GR3b may relatively accurately control the electron energy and may also increase in density of the electrons to effectively generate the ultra-low electron temperature plasma PS_L in the second chamber part CB2.

In an embodiment, when argon plasma is used, a potential difference between a substrate potential and a plasma potential of the second chamber part may be greater about 5 times than that of an electron temperature. For example, when a general electron temperature is about 3 eV, the potential difference may be about 15 V. In the case of a ultra-low electron temperature plasma having an electron temperature of about 1 eV or less, the potential difference may be about 5 V or less. A potential difference between the ultra-low electron temperature plasma and the substrate may be about 5.0V or less. In the case of a ultra-low electron temperature plasma having an electron temperature of about 0.5 eV or less, a potential difference between the ultra-low electron temperature plasma and the substrate may be about 2.5 V or less.

Figure 5A:
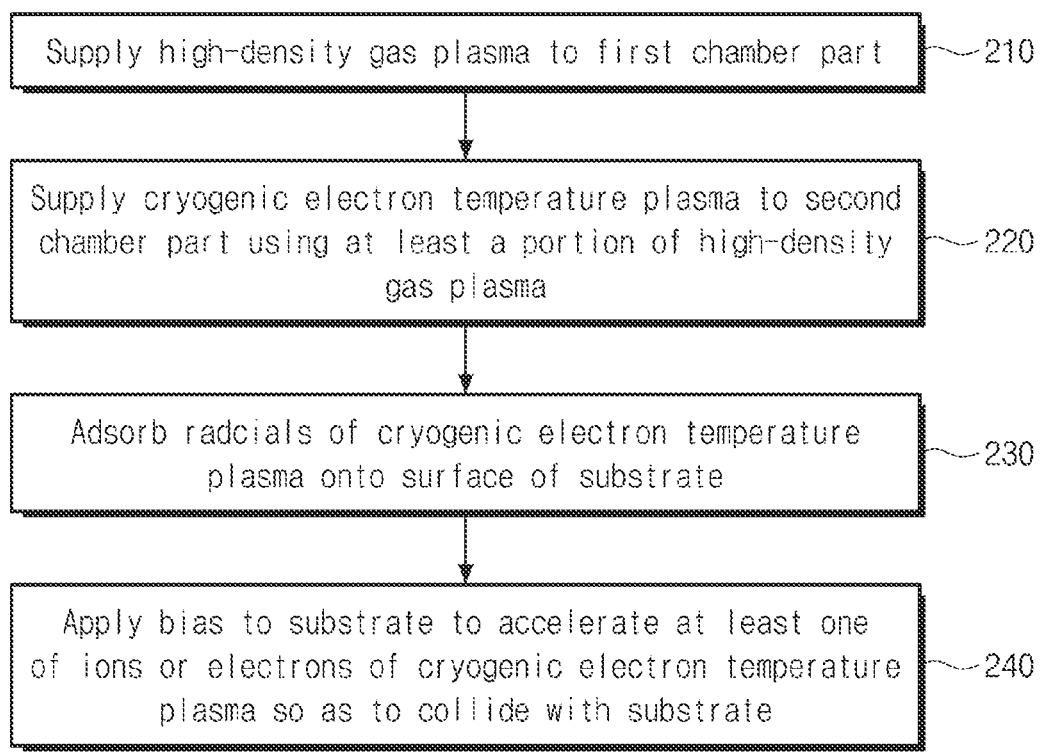
FIG. 5A is a flowchart illustrating an etching method according to an embodiment.

FIG. 5A is a flowchart illustrating an etching method according to an embodiment.

An etching method may refer to a method for etching one surface of an etch target using the etching apparatus described with reference to FIGS. 1 to 4.

Referring to FIGS. 1, 2 and 5A, the etching method may include a process (210) of supplying high-density gas plasma PS_H to a first chamber part CB1, a process (220) of supplying ultra-low electron temperature plasma PS_L to a second chamber part CB2 using at least a portion of the high-density gas plasma PS_H, a process (230) of adsorbing radicals of the ultra-low electron temperature plasma PS_L to a surface of a substrate, and a process (240) of applying a bias to the substrate 102 to accelerate at least one of ions 134 or electrons 133 of the ultra-low electron temperature plasma PS_L so as to collide with the substrate 240. When at least one of the ions 134 and the electrons 133 of the ultra-low electron temperature plasma PS_L is accelerated to collide with the substrate, an etch target may be desorbed. Since the etch target is desorbed in the ultra-low electron temperature plasma PS_L, incidental damage of the substrate 102 due to the ions 134 or the electrons 133 may be prevented.

FIG. 5B is a flowchart an etching method according to an embodiment.

Referring to FIGS. 1, 2 and 5B, the etching method may include a process (310) of supplying high-density gas plasma PS_H to a first chamber part CB1, a process (S320) of allowing high-energy electrons 132 of the high-density gas plasma PS_H to pass through a grid GR, a process (330) of supplying ultra-low electron temperature plasma PS_L to a second chamber part CB2, a process (340) of adsorbing radicals of the ultra-low electron temperature plasma PS_L to a surface of a substrate 102, and a process (350) of applying a bias to the substrate 102 to accelerate at least one of ions 134 or electrons 133 of the ultra-low electron temperature plasma PS_L so as to collide with the substrate 102.

Figure 5C:
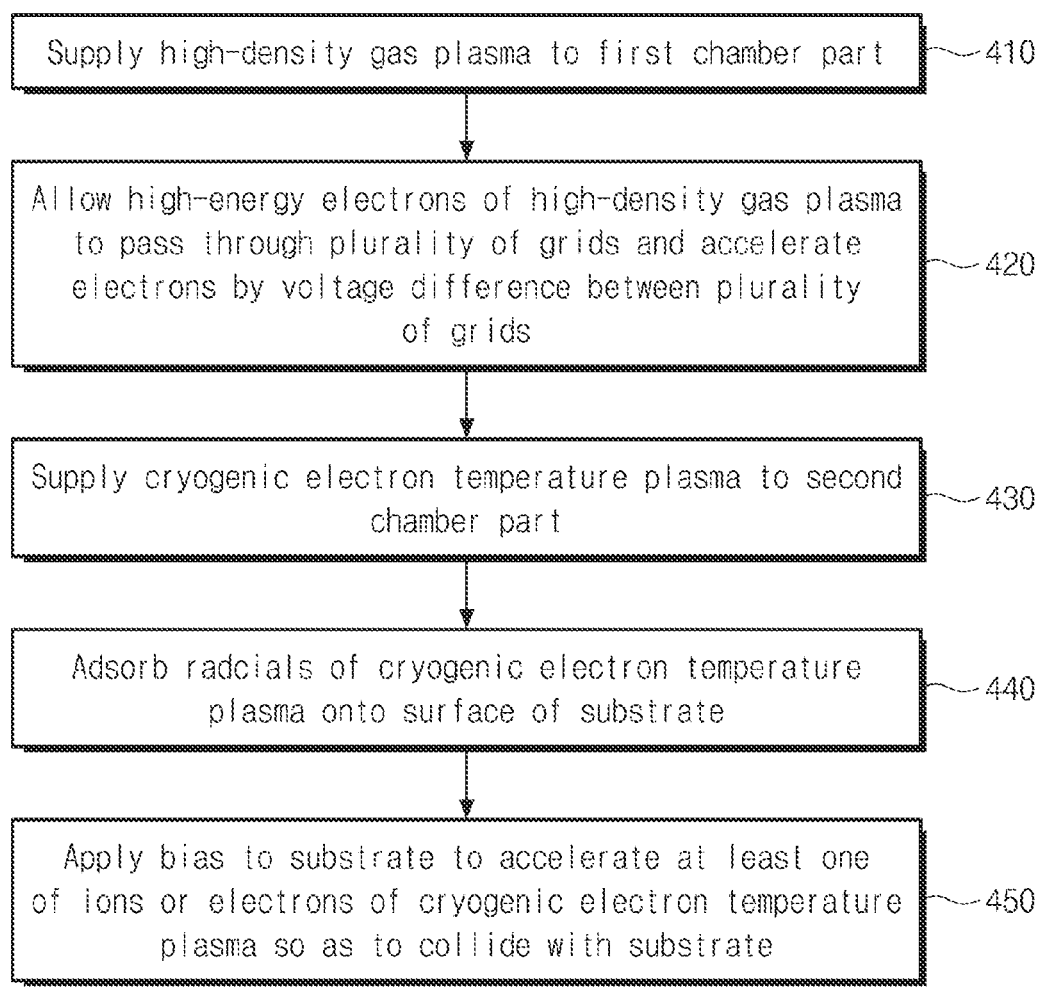
FIG. 5C is a flowchart illustrating an etching method according to an embodiment.

FIG. 5C is a flowchart an etching method according to an embodiment.

Referring to FIGS. 1, 3 and 5C, the etching method includes a process (410) of supplying high-density gas plasma PS_H to a first chamber part CB1, a process (420) of allowing high-energy electrons 132 of the high-density gas plasma PS_H to pass through a plurality of grids GRa so as to accelerate electrons by a voltage difference between the plurality of grids GRa, a process (430) of supplying ultra-low electron temperature plasma PS_L to a second chamber part CB2, a process (440) of adsorbing radicals of the ultra-low electron temperature plasma PS_L to a surface of a substrate 102, and a process (450) of applying a bias to the substrate 102 to accelerate at least one of ions 134 or electrons 133 of the ultra-low electron temperature plasma PS_L so as to collide with the substrate 102.

Figure 5D:
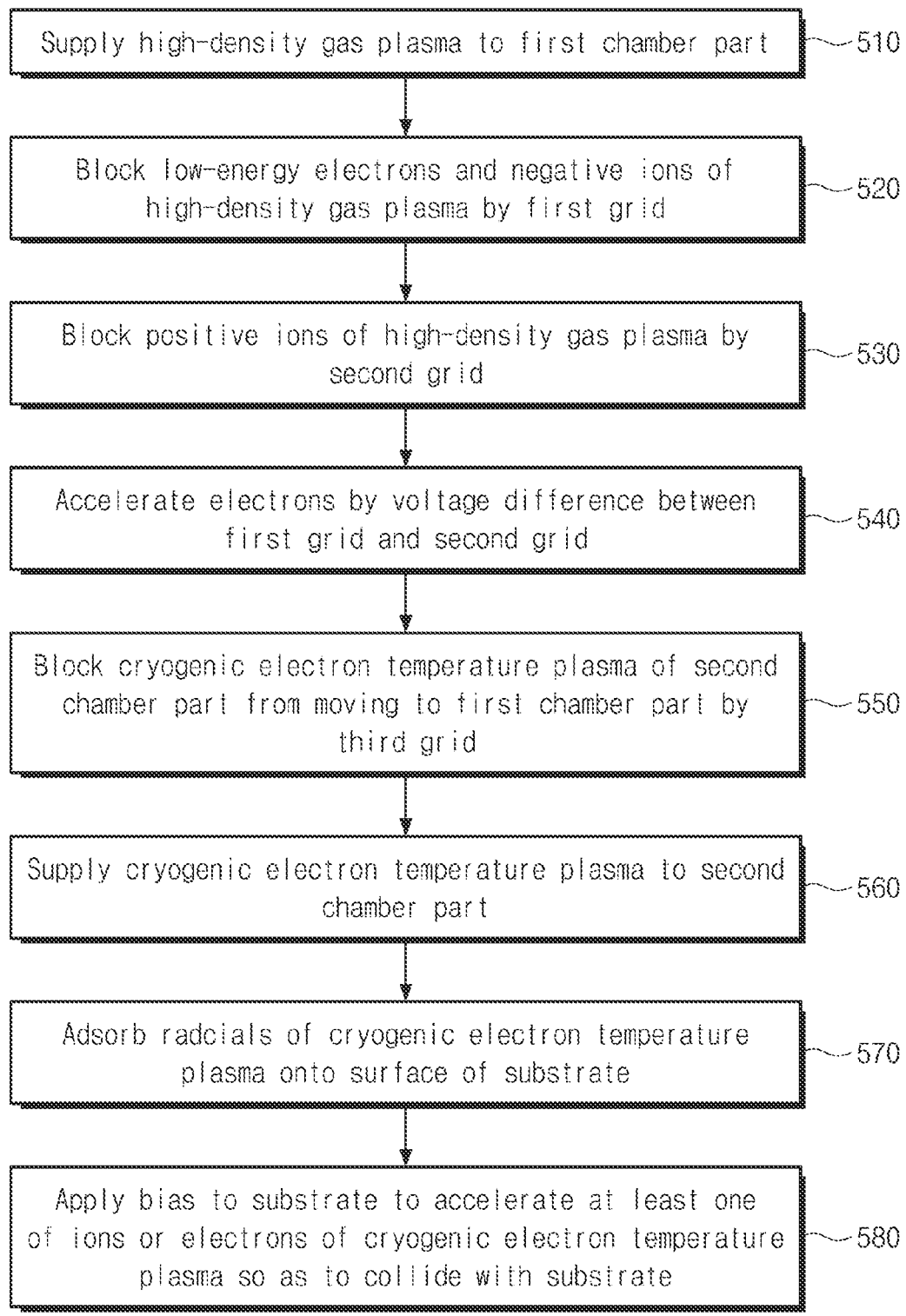
FIG. 5D is a flowchart illustrating an etching method according to an embodiment.

FIG. 5D is a flowchart an etching method according to an embodiment.

Referring to FIGS. 1, 3 and 5D, the etching method includes a process (510) of supplying high-density gas plasma PS_H to a first chamber part CB1, a process (520) of blocking low-energy electrons 131 and negative ions of the high-density gas plasma PS_H by a first grid GR1b, a process (530) of blocking positive ions of the high-density gas plasma PS_H by a second grid GR2b, a process (540) of accelerating electrons 132 by a voltage difference between the first grid GR1b and the second grid GR2b, a process (550) of blocking plasma of a second chamber part CB2 from moving to the first chamber part CB1 by a third grid GR3b, a process (560) of supplying ultra-low electron temperature plasma PS_L to the second chamber part CB2, a process (570) of adsorbing radicals of the ultra-low electron temperature plasma PS_L to a surface of a substrate 102, and a process (580) of applying a bias to the substrate 102 to accelerate at least one of ions 134 or electrons 133 of the ultra-low electron temperature plasma PS_L so as to collide with the substrate 102.

Figure 6A:
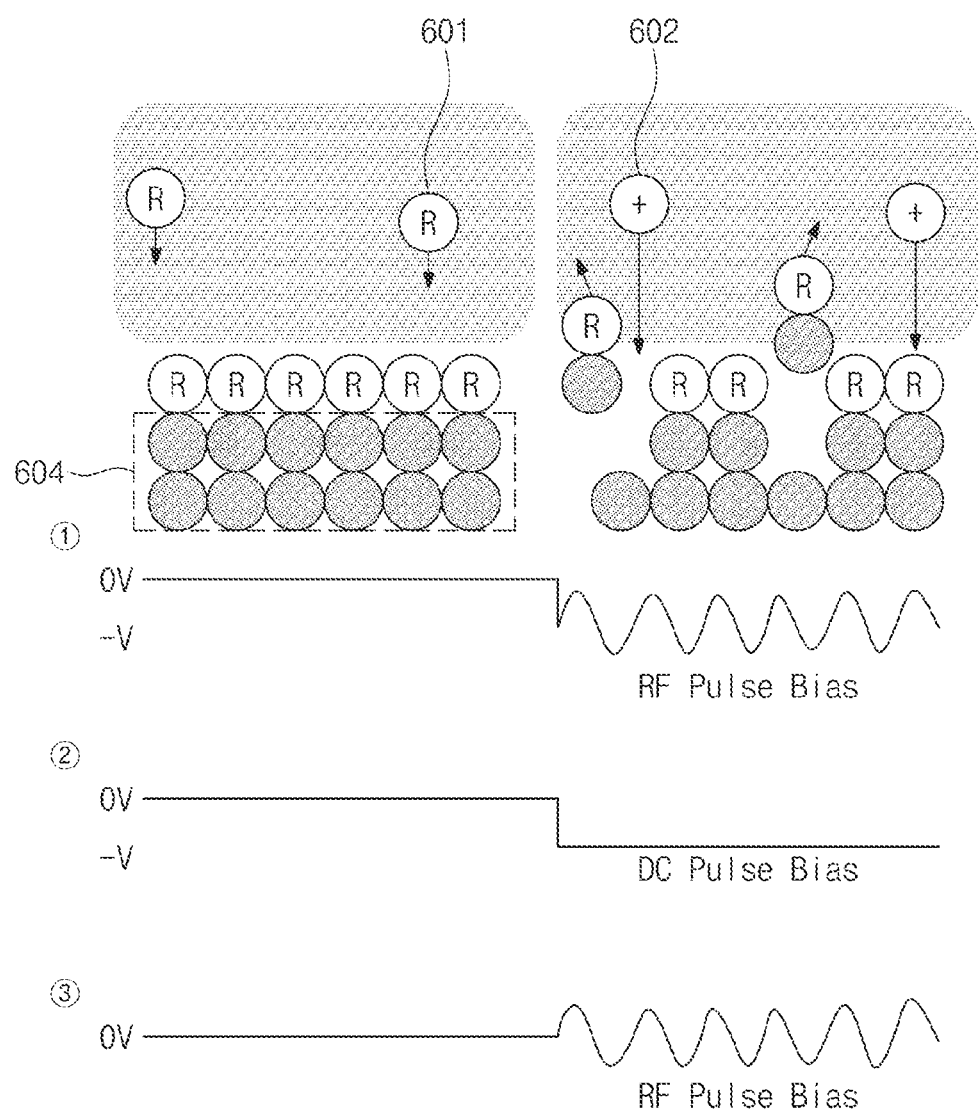
FIGS. 6A and 6B are views illustrating an example of an etching method using ultra-low electron temperature plasma according to an embodiment.
Figure 6B:
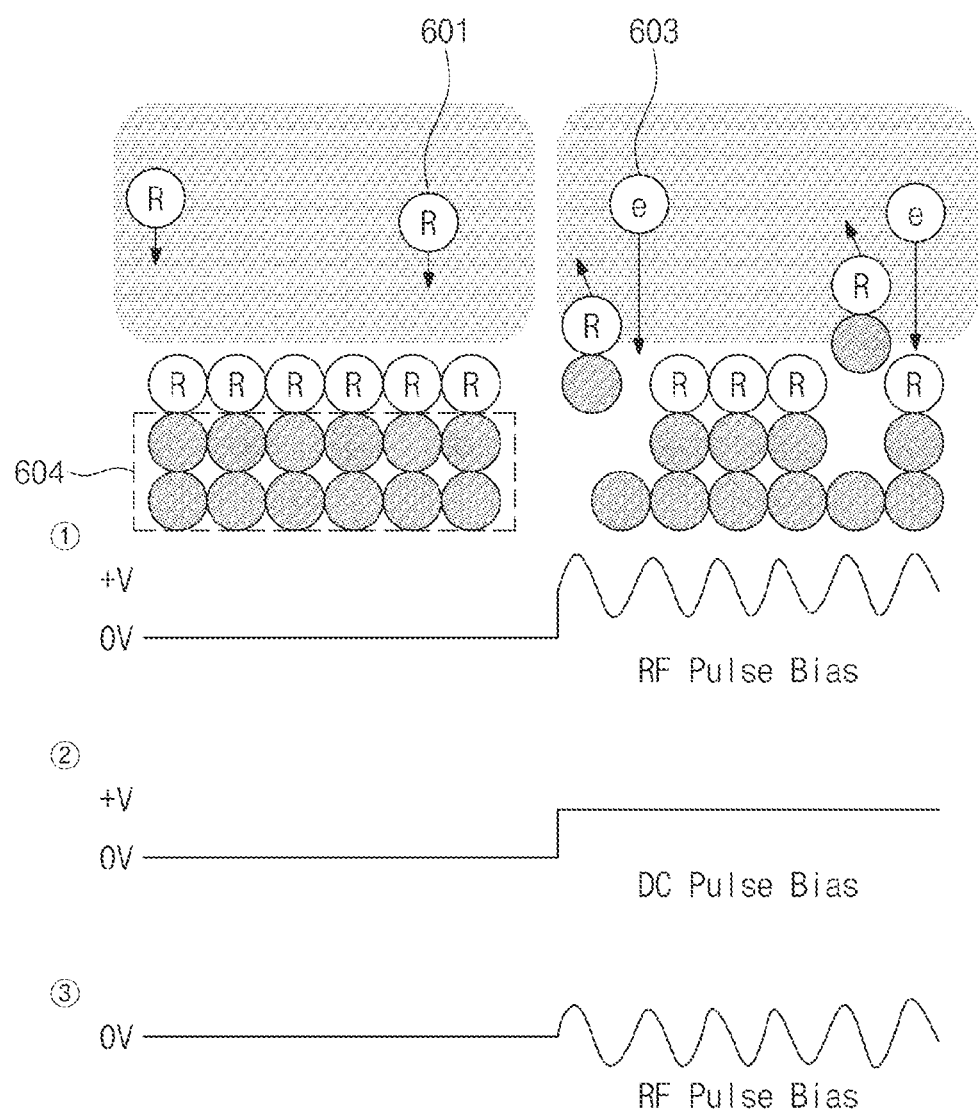

FIGS. 6A and 6B are views illustrating an example of an etching method using ultra-low electron temperature plasma according to an embodiment.

In FIGS. 6A and 6B, ① indicates an RF pulse bias applied to a substrate 604, ② indicates a DC pulse bias applied to the substrate 604, and ③ indicates an RF pulse bias applied to the substrate 604.

Referring to FIG. 6A, an etching method using beam of ions 602 is provided. If no bias is applied to the substrate 604, and a potential of the substrate is about 0 V, a sheath potential on the substrate 604 may be very low or may not be generated due to a very low electron temperature. In this case, electrically neutral radicals 601 may be adsorbed on a surface of the substrate 604.

Thereafter, when a negative bias is applied through at least a portion of the substrate 604, electrically positive ions 602 are attracted to the substrate 604. The electrically positive ions 602 may transfer energy obtained while being attracted to a surface layer of the substrate 604 on which the radicals 601 are adsorbed so that the surface on which the radicals 601 are adsorbed is etched. In the ultra-low electron temperature plasma, even if this method is repeated, since there is no or little damage to the substrate 604, the etch target may be etched without performing a purge process.

In addition, if a magnitude of the negative bias applied to the substrate 604 is adjusted, energy of the ions directed to the substrate may be adjusted, and the plasma process may be performed by selecting ion energy suitable for the process.

Referring to FIG. 6B, an etching method using electrons 603 is provided. When a positive bias is applied through at least a portion of the substrate 604, the electrons 603 having an electrically negative polarity may be accelerated to receive energy, thereby bombarding the substrate. In this case, the electrons 603 that obtains the energy become a medium for transferring the energy to the substrate 604.

If a magnitude of the positive bias applied to the substrate 604 is adjusted, energy of the electrons 603 directed to the substrate may be adjusted, and the energy of the electrons 603 suitable for the process may be selected so that the process proceeds.

Particularly, since the electrons have a much smaller mass than ions, even when a relatively high voltage is applied to the substrate, only the energy required for the desorption reaction may be transferred without damaging the substrate.

Figure 7:
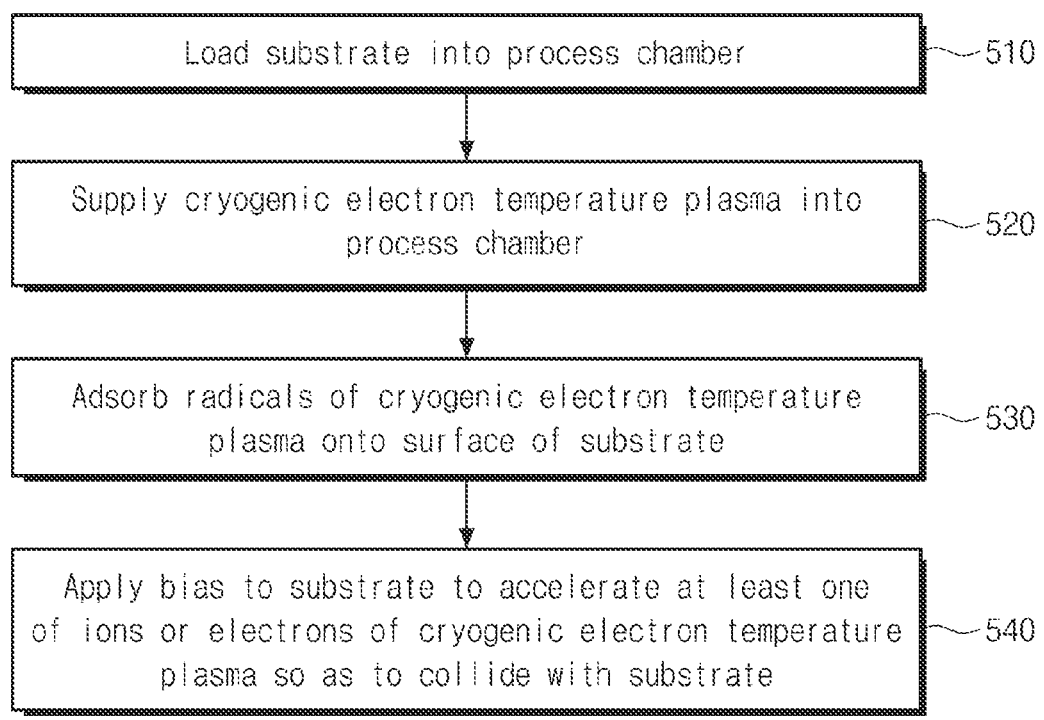
FIG. 7 is a flowchart illustrating an etching method according to an embodiment.

FIG. 7 is a flowchart illustrating an etching method according to an embodiment.

Referring to FIG. 7, a substrate may be loaded into a process chamber (510). For example, the substrate of which a layer to be etched (hereinafter, referred to as an etched layer) is exposed may be seated on a support inside the process chamber. Here, an etch mask for etching may be formed on the substrate so that a partial surface of the substrate is exposed.

The etched layer may be a semiconductor substrate itself containing silicon single crystal or polysilicon or at least silicon, or the etched layer may be formed at a predetermined thickness on the surface of the semiconductor substrate. The etch mask may be made of a photoresist, but the embodiment of the inventive concept is not limited thereto.

Ultra-low electron temperature plasma may be supplied into the process chamber (520).

To supply the ultra-low electron temperature plasma into the process chamber, high-density gas plasma may be used. For example, when high-energy electrons contained in the high-density gas plasma move into the process chamber, and the electron energy is amplified, neutral gases existing in the process chamber may be ionized to discharge the plasma.

Through this process, low-energy electrons generated through the ionization in the process chamber and electrons that have lost energy by participating in the ionization reaction may generate a very low electron temperature, and the electrons may generate the ultra-low electron temperature plasma.

Radicals of the ultra-low electron temperature plasma may be adsorbed on the surface of the substrate (530).

For example, when a potential of the substrate is about 0 V, a sheath potential is not generated on the substrate due to the very low electron temperature, and even if the sheath potential is generated, a very low sheath potential may be generated. Thus, since an electric field in which charged particles such as ions or electrons contained in the ultra-low electron temperature plasma are accelerated to the substrate is not generated, only electrically neutral radicals may adhere to the substrate by diffusion, and thus, an adsorption reaction may occur.

A bias may be applied through at least a portion of the substrate to accelerate at least one of the electrons and ions contained in the ultra-low electron temperature plasma, thereby colliding with the substrate (540).

For example, when a bias such as an RF or DC voltage is applied through at least a portion of the substrate, according to polarities of the voltage, electrons may be directed to the substrate 102 in case of a positive (+) voltage, and (positive) ions may be directed to the substrate in case of a negative (−) voltage. As a result, a portion of the surface of the substrate coupled to the radicals adsorbed with their energy may be desorbed.

Up to now, the components and operation method of the etching apparatus and method according to an embodiment have been described in detail through the drawings.

In the etching apparatus and method according to the embodiments, the intensity of the substrate voltage may be adjusted to control the energy of the particles incident into the substrate, and also, since only the energy required for the surface reaction of the substrate is supplied, the etching process may be enable without damaging the substrate.

In addition, in the etching apparatus and method according to the embodiments, unlike the typical etching method or the etching method using the neutral beam, the time during the desorption process may be reduced, or the purge process may be omitted to significantly reduce the process time, thereby improving productivity.

In the etching apparatus and method according to the embodiments of the inventive concept, the ultra-low electron temperature plasma may be supplied by adjusting the voltages of the plurality of grids and substrates.

In the etching apparatus and method according to the embodiments of the inventive concept, the substrate may be etched with the little damage by the low sheath potential in the ultra-low electron temperature plasma region.

In the etching apparatus and method according to the embodiments of the inventive concept, the intensity of the substrate voltage may be adjusted to control the energy of the particles incident into the substrate, and also, since only the energy required for the surface reaction of the substrate is supplied, the etching process may be enable without damaging the substrate.

The effects of the present invention are not limited to the aforementioned object, but other effects not described herein will be clearly understood by those skilled in the art from descriptions below.

Although the embodiment of the present invention is described with reference to the accompanying drawings, those with ordinary skill in the technical field of the present invention pertains will be understood that the present invention can be carried out in other specific forms without changing the technical idea or essential features. Thus, the above-disclosed embodiments are to be considered illustrative and not restrictive.

What is claimed is:

1. An etching method comprising:
    loading a substrate into a process chamber, the process chamber comprising a first chamber part and a second chamber part divided by a grid, the second chamber part including a support onto which the substrate is loaded;
    supplying high-density gas plasma to the first chamber part, the high-density gas plasma including high-energy electrons and low energy electrons;
    supplying ultra-low electron temperature plasma to the second chamber part using at least a portion of the high-density gas plasma, the supplying of the ultra-low electron temperature plasma including
    applying a first bias to the grid so that the high-energy electrons pass through the grid and the low energy electrons are blocked by the grid, the first bias being a voltage of several tens to several hundreds of V, and the high-energy electrons from the first chamber part collide with neutral gases present in the second chamber part to generate ions and cryogenic electrons having an electron temperature of about 1.0 eV or less;
    applying a second bias of about 0V to the substrate via the support to adsorb radicals of the ultra-low electron temperature plasma to a surface of the substrate; and
    applying a third bias to the substrate via the support to accelerate one of ions or electrons of the ultra-low electron temperature plasma so as to collide with the substrate, the third bias being one of a positive voltage or a negative voltage.

2. The etching method of claim 1, wherein the supplying of the ultra-low electron temperature plasma to the second chamber part comprises:
    allowing high-energy electrons of the high-density gas plasma to pass through a grid between the first chamber part and the second chamber part;
    applying a voltage to the grid; and
    allowing the high-energy electrons passing through the grid to collide with ions of the second chamber part so as to generate the ultra-low electron temperature plasma.

3. The etching method of claim 1, wherein the supplying of the ultra-low electron temperature plasma to the second chamber part comprises:
    allowing high-energy electrons of the high-density gas plasma to pass through a plurality of grids between the first chamber part and the second chamber part; and
    accelerating the high-energy electrons by a potential difference between the plurality of grids.

4. The etching method of claim 1, wherein the grid comprises a first grid, a second grid, and a third grid that are between the first chamber part and the second chamber part, and the supplying of the ultra-low electron temperature plasma to the second chamber part comprises
    blocking low-energy electrons and negative ions of the high-density gas plasma of the first chamber part by the first grid,
    blocking positive ions of the high-density gas plasma by the second- grid, and
    blocking the ultra-low electron temperature plasma of the second chamber part from moving to the first chamber part by the third grid.

5. The etching method of claim 1, wherein the applying the third bias to the substrate comprises applying a pulse voltage.

6. The etching method of claim 4, wherein the supplying of the ultra-low electron temperature plasma to the second chamber part further comprises accelerating the electrons through a potential difference between the first grid and the second grid.

7. The etching method of claim 1, wherein the adsorbing the radicals of the ultra-low electron temperature plasma onto the surface of the substrate comprises applying a bias of about 0 V through at least a portion of the substrate.

8. The etching method of claim 6, wherein the potential difference between the first grid and the second grid is about 5.0 V or less.

9. An etching method comprising:
    loading a substrate into a process chamber, the process chamber comprising a first chamber part and a second chamber part, divided by a first grid, a second grid, and a third grid;
    supplying high-density gas plasma to the first chamber part based on a first bias of several tens to several hundreds of V applied to the first grid, the second grid, and the third grid, the high-density gas plasma including high-energy electrons and low energy electrons;
    blocking low-energy electrons and negative ions of the high-density gas plasma by the first grid based on the first bias of several tens to several hundreds of V applied to the first grid, the second and the third grid;
    blocking positive ions of the high-density gas plasma by the second grid;
    accelerating the electrons through a potential difference between the first grid and the second grid;
    blocking plasma of the second chamber part from moving to the first chamber part by the third grid;
    allowing high-energy electrons of the high-density gas plasma passing through the first grid, the second grid, and the third grid to collide with the ions of the second chamber part so as to generate ultra-low electron temperature plasma;
    applying a second bias of about 0 V to the substrate to adsorb radicals of the ultra-low electron temperature plasma onto a surface of the substrate; and
    applying a third bias to the substrate to accelerate one of ions or electrons of the ultra-low electron temperature plasma so as to collide with the substrate, the third bias being one of a positive bias or a negative bias.

* * * * *